US011659311B2

(12) United States Patent
Lynch et al.

(10) Patent No.: US 11,659,311 B2
(45) Date of Patent: May 23, 2023

(54) SOUND PORT ADAPTER FOR MICROPHONE ASSEMBLY

(71) Applicant: Knowles Electronics, LLC, Itasca, IL (US)

(72) Inventors: Brian Lynch, Arlington Heights, IL (US); Alexander Grossman, Geneva, IL (US); Ben Vondersaar, Chicago, IL (US); Matthew Manley, Crystal Lake, IL (US)

(73) Assignee: KNOWLES ELECTRONICS, LLC, Itasca, IL (US)

( * ) Notice: Subject to any disclaimer, the term of this patent is extended or adjusted under 35 U.S.C. 154(b) by 34 days.

(21) Appl. No.: 17/137,702

(22) Filed: Dec. 30, 2020

(65) Prior Publication Data
US 2021/0204050 A1 Jul. 1, 2021

Related U.S. Application Data

(60) Provisional application No. 62/954,910, filed on Dec. 30, 2019.

(51) Int. Cl.
*H04R 19/00* (2006.01)
*H04R 1/08* (2006.01)
*B81B 7/00* (2006.01)
*H04R 1/02* (2006.01)
*H04R 1/04* (2006.01)

(52) U.S. Cl.
CPC ............. *H04R 1/08* (2013.01); *B81B 7/0077* (2013.01); *H04R 1/026* (2013.01); *H04R 1/04* (2013.01)

(58) Field of Classification Search
CPC ..... H04R 19/00; H04R 19/005; H04R 19/016
See application file for complete search history.

(56) References Cited

U.S. PATENT DOCUMENTS

| 2,518,805 | A | 8/1950 | Frank |
| 5,539,834 | A | 7/1996 | Bartlett et al. |
| 5,890,072 | A | 3/1999 | Rabe |
| 6,950,529 | B2 | 9/2005 | Wilmink |
| 7,242,089 | B2 | 7/2007 | Minervini |
| 7,280,855 | B2 | 10/2007 | Hawker et al. |
| 8,170,244 | B2 * | 5/2012 | Ryan ...................... H04R 1/406 381/174 |
| 8,199,939 | B2 * | 6/2012 | Suvanto ................. H04R 19/04 381/175 |

(Continued)

FOREIGN PATENT DOCUMENTS

| CN | 205510405 U | 8/2016 |
| CN | 108260037 A | 7/2018 |

(Continued)

*Primary Examiner* — Suhan Ni

(57) ABSTRACT

A one-piece sound port adapter for a microphone assembly includes a body member configured to be fitted over a sound port of the microphone assembly. The body member includes an acoustic channel defined in part by a cavity having a sound inlet and a sound outlet, where the sound outlet is acoustically coupled to the sound port. A wall portion of the body member extends into the cavity and configured to modify an acoustic property of the acoustic channel. When mounted, the one-piece sound port adapter converts the microphone assembly from a top or bottom port microphone assembly to a side-port microphone assembly.

20 Claims, 8 Drawing Sheets

(56) References Cited

U.S. PATENT DOCUMENTS

| | | | |
|---|---|---|---|
| 8,325,951 B2* | 12/2012 | Wang | B81B 7/0061 |
| | | | 381/175 |
| 8,433,084 B2 | 4/2013 | Conti et al. | |
| 8,767,982 B2 | 7/2014 | Harney et al. | |
| 8,824,719 B2 | 9/2014 | Tanaka et al. | |
| 8,861,764 B2 | 10/2014 | Tanaka et al. | |
| 8,879,767 B2 | 11/2014 | Wickstrom | |
| 8,965,027 B2* | 2/2015 | Bolognia | H04R 1/222 |
| | | | 381/175 |
| 8,983,105 B2 | 3/2015 | Reining | |
| 9,078,063 B2 | 7/2015 | Loeppert et al. | |
| 9,351,062 B2 | 5/2016 | Inoda et al. | |
| 9,374,643 B2 | 6/2016 | Szczech et al. | |
| 9,479,854 B2 | 10/2016 | Loeppert et al. | |
| 9,544,678 B2 | 1/2017 | Lorenz et al. | |
| 9,794,661 B2 | 10/2017 | Watson et al. | |
| 9,800,971 B2 | 10/2017 | Manley et al. | |
| 10,009,694 B2 | 6/2018 | Sibbald et al. | |
| 10,284,963 B2 | 5/2019 | Koymen et al. | |
| 10,291,973 B2 | 5/2019 | Lim et al. | |
| 10,334,339 B2 | 6/2019 | Pennock et al. | |
| 10,386,223 B2 | 8/2019 | Mögelin et al. | |
| 10,433,071 B2 | 10/2019 | Pal et al. | |
| 10,591,326 B2 | 3/2020 | Lim et al. | |
| 10,654,712 B2 | 5/2020 | Albers et al. | |
| 10,755,688 B2 | 8/2020 | Hayashi | |
| 10,818,577 B2 | 10/2020 | Miehl et al. | |
| 10,820,083 B2 | 10/2020 | Szczech et al. | |
| 10,947,108 B2 | 3/2021 | Mögelin et al. | |
| 11,051,094 B2 | 6/2021 | Schultz | |
| 11,082,774 B2 | 8/2021 | Miehl et al. | |
| 11,128,958 B2 | 9/2021 | Allegato et al. | |
| 2007/0261910 A1 | 11/2007 | Kasai et al. | |
| 2008/0247587 A1 | 10/2008 | Sato | |
| 2009/0175477 A1 | 7/2009 | Suzuki et al. | |
| 2013/0070950 A1 | 3/2013 | Chen | |
| 2014/0233756 A1 | 8/2014 | Inoda | |
| 2016/0066095 A1 | 3/2016 | Szczech et al. | |
| 2016/0071506 A1 | 3/2016 | Qutub et al. | |
| 2018/0029880 A1* | 2/2018 | Lim | B81C 1/0023 |
| 2020/0112800 A1 | 4/2020 | Lee et al. | |
| 2020/0239301 A1 | 7/2020 | Albers et al. | |
| 2020/0286492 A1 | 9/2020 | Lesso | |
| 2020/0382862 A1 | 12/2020 | Hrudey et al. | |
| 2021/0204056 A1 | 7/2021 | Bradt et al. | |
| 2021/0239559 A1 | 8/2021 | Unruh et al. | |
| 2021/0321185 A1 | 10/2021 | Kim et al. | |
| 2021/0400392 A1 | 12/2021 | Zhang et al. | |

FOREIGN PATENT DOCUMENTS

| | | |
|---|---|---|
| CN | 109327777 A | 2/2019 |
| WO | 2020/210134 A1 | 10/2020 |

* cited by examiner

US 11,659,311 B2

SOUND PORT ADAPTER FOR MICROPHONE ASSEMBLY

RELATED APPLICATIONS

This application claims priority to U.S. Provisional Patent Application Ser. No. 62/954,910 filed on Dec. 30, 2019, entitled "Sound Port Adapter for Microphone Assembly," the entire contents of which are hereby incorporated by reference.

TECHNICAL FIELD

The present disclosure relates generally to microphone assemblies and more particularly to microphones with sound port adapters configured for side porting, acoustic tuning, and ingress protection.

BACKGROUND

Microphones have been used in various types of devices ranging from hearing aids to personal computers. A microphone generally includes a transducer disposed on a substrate or base and enclosed by a housing (e.g., a cup or cover with walls). A sound port may extend through the base (for a bottom port device) or through the top of the housing (for a top port device). In any case, sound traverses through the sound port and is converted into an electrical signal by the transducer.

In various applications, there may be a need for the microphone to have alternative porting options (e.g., a side port), acoustic tuning abilities, and/or means to prevent dirt or moisture ingress-up. Users of microphones can thus benefit from improvements in sound port adapter designs.

The various aspects, features and advantages of the present disclosure will become more fully apparent to those having ordinary skill in the art upon consideration of the following Detailed Description and the accompanying drawings described below.

BRIEF DESCRIPTION OF THE DRAWINGS

The disclosure is described in more detail below in connection with the appended drawings and in which like reference numerals represent like components.

DETAILED DESCRIPTION

Figure 1:
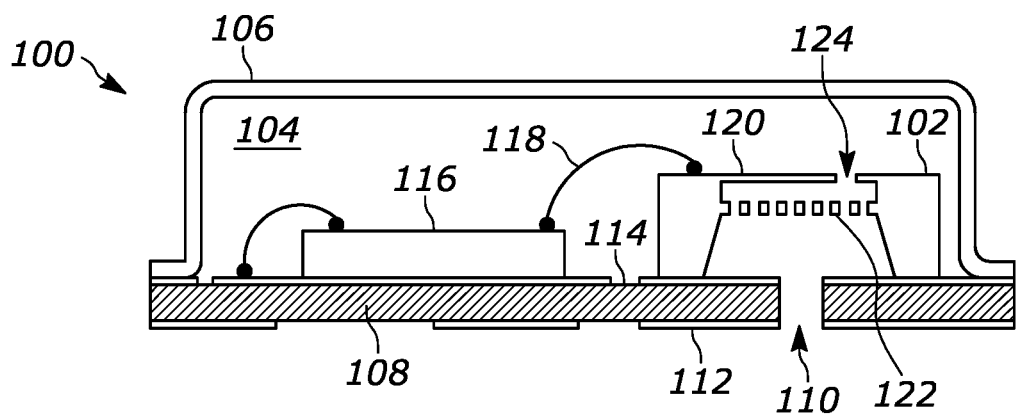
FIG. 1 is a cross-sectional view of a microphone assembly of FIG. 2.

According to one aspect of the disclosure, a sound port adapter for a microphone assembly is an unassembled unitary member comprising a body member and an acoustic channel disposed through the body member. The body member includes a mounting surface to mount on a surface of the microphone assembly on which a sound port is disposed. In one example, the body member is a conductive member electrically connectable to a ground plane of the microphone assembly when mounted on the surface of the microphone assembly. When mounted, the sound port adapter converts the microphone assembly from a top or bottom port microphone assembly to a side-port microphone assembly. The acoustic channel is defined in part by a cavity having a sound inlet and a sound outlet disposed on the mounting surface, wherein the sound outlet is acoustically coupled to the sound port.

In some embodiments, a wall portion of the body member extends into the cavity and modifies an acoustic property of the acoustic channel such as one or more of an inertance and an acoustic resistance of the acoustic channel. In certain embodiments, the wall portion is also configured to obstruct entry of debris into the acoustic channel for ingress protection.

In some embodiments where the wall portion modifies the inertance of the acoustic channel, the wall portion is configured to form a tortuous (e.g., winding) acoustic channel or a snail tube acoustic channel. Other non-straight paths for the acoustic channel are also contemplated.

In certain embodiments where the wall portion modifies the acoustic resistance of the acoustic channel, the wall portion is configured to have one or more discrete wall portions (e.g., cylindrical pillars) arranged in spaced-apart relation across the acoustic channel and/or a single discrete wall portion (e.g., an arcuate barrier) disposed partially across the acoustic channel. Other discrete wall configurations are also contemplated.

In embodiments where the wall portion modifies both the inertance and the acoustic resistance of the acoustic channel, the wall portion is configured to have one or more discrete wall portions arranged, in spaced-apart relation, across a tortuous acoustic channel. Other combinations of discrete walls and tortuous channels are also contemplated.

According to another aspect of the disclosure, an apparatus comprises a one-piece port adapter operatively coupled over an acoustic port of a microphone assembly. The microphone assembly comprises a housing containing an acoustic transducer in acoustic communication with the acoustic port. In one example, the transducer is a microelectromechanical systems (MEMS) transducer whose output is electrically coupled to an integrated circuit in the housing and the electrical circuit is electrically coupled to electrical contacts on an external-device interface. The one-piece port adapter includes an acoustic channel with an acoustic tuning structure that modifies acoustic energy moving through the acoustic channel to the acoustic port.

A microphone assembly generally includes various components enclosed in a housing. In FIG. 1, a cross-section of a microphone assembly 100 along lines A-A is shown (see FIG. 2). The microphone assembly comprises a transducer 102, configured to convert sound into an electrical signal, disposed in a housing 104 having a lid or cover 106 mounted on a base 108 having a sound port 110. The sound port extends from an outer surface 112 to an inner surface 114 of the housing. The microphone assembly also includes an electrical circuit 116 (e.g., an integrated circuit) disposed in the housing and electrically coupled to the transducer by one or more wire bonds 118 and to contacts on an external-device (e.g., host) interface of the housing. The electrical circuit conditions the electrical signal from the transducer before providing the conditioned signal at the external-device interface. Such conditioning may include buffering, amplification, filtering, analog-to-digital (A/D) conversion for digital devices, and signal protocol formatting among other processing.

The example microphone assembly of FIG. 1 is a bottom port device having the transducer mounted on the base in acoustic communication with the sound port. In other embodiments, the microphone assembly may be a top port device having the transducer mounted over a sound port on the lid. The transducer may be a capacitive, piezoelectric or other electro-acoustic transduction device. FIG. 1 shows a MEMS capacitive transducer including a diaphragm 120 movable relative to a back plate 122. The diaphragm may include a pierce or vent 124 for pressure equalization.

Figure 3:
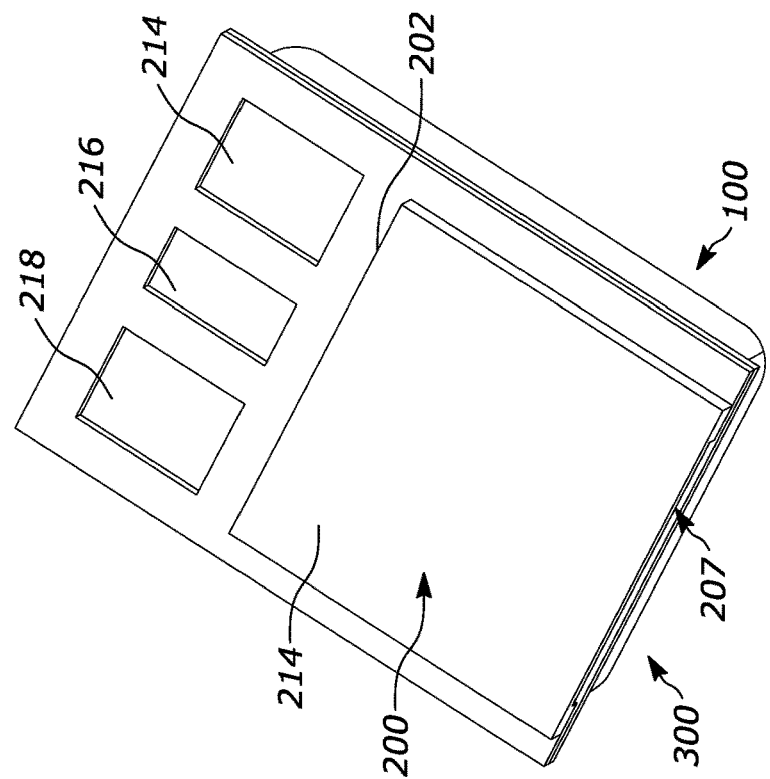
FIG. 3 is a perspective view of a side-port microphone assembly in accordance with one example.
Figure 2:
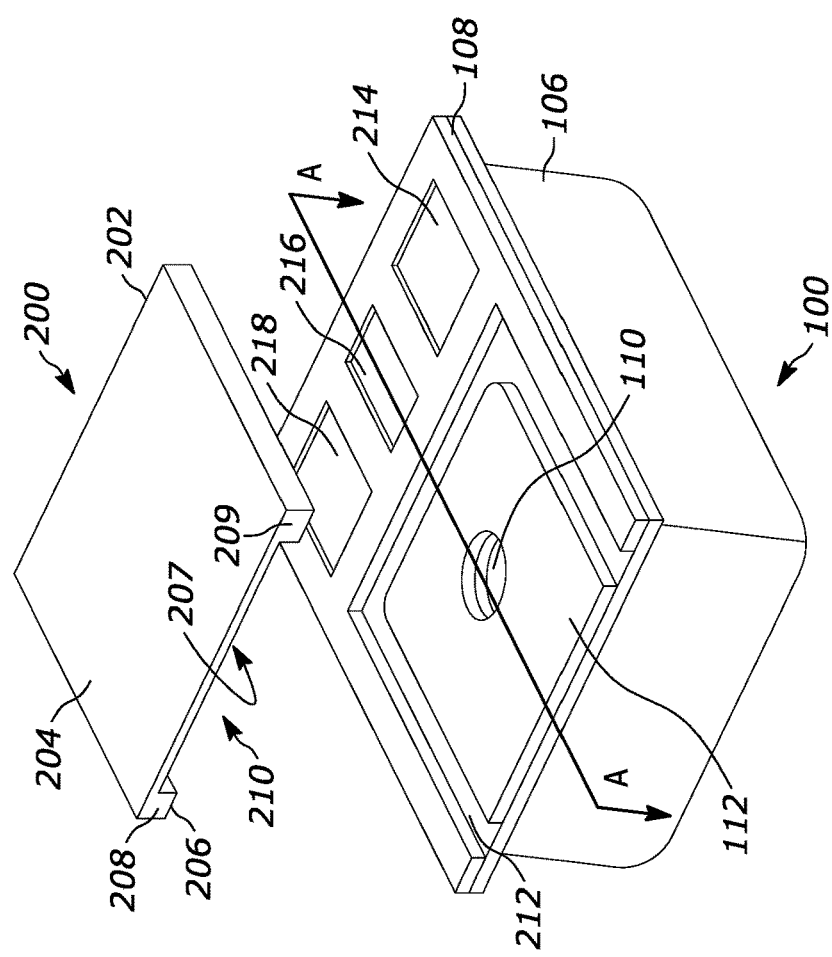
FIG. 2 is a perspective view of the microphone assembly of FIG. 1 with a sound port adapter in accordance with one example.

The microphone assembly may be fitted with a sound port adapter to direct and control the passage of sound to the sound port. FIG. 2 shows the microphone assembly 100 with a sound port adapter 200. FIG. 3 shows the sound port adapter mounted to the microphone assembly to convert the microphone assembly from a bottom port microphone assembly to a side-port microphone assembly. That is, when mounted, the sound port adapter is configured to re-route the entry of sound to the sound port from a side port location 300. In other implementations, a top port microphone assembly can also be converted to a side-port microphone assembly by using the sound port adapter.

In this example, the sound port adapter is an unassembled unitary or one-piece member. The sound port adapter comprises a body member 202 having a top surface 204 and a bottom or mounting surface 206. The mounting surface includes an acoustic channel 207 defined by sidewalls 208, 209. The acoustic channel is disposed through the body member to create a sound inlet 210. The sound inlet also defines the side port location. It should be noted that the side port location can be oriented to any side of the microphone assembly.

The mounting surface is configured to mount on the outer surface 112 of the microphone assembly on which the sound port 110 is disposed. Once mounted, the outer surface forms the bottom of the acoustic channel. The outer surface includes a ground plane 212 configured to correspond to an outline of the sound port adapter. For example, the shape of the ground plane corresponds to the sidewalls of the sound port adapter such that the sidewalls can be attached to the ground plane (e.g., by using solder or cement). The outer surface also includes a plurality of electrical contacts 214-218 (e.g., supply voltage, clock, data, etc.) for the external-device interface.

In one embodiment, the sound port adapter is formed from a conductive material like metal. As such, the body member is conductive, and the mounting surface is electrically connectable to the ground plane. In other embodiments, the sound port adapter may be made from other suitable materials such as plastic, ceramic, glass, etc. In these cases, the body member is not conductive and does not need to be electrically grounded. The sound port adapter can be constructed using any suitable technique such as etching, laser ablation, molding, 3D printing, etc. While FIGS. 2-15 show the sound port adapter as being square in shape, other suitable shapes (e.g., rectangular, trapezoid, oval, etc.) are contemplated.

Figure 4:
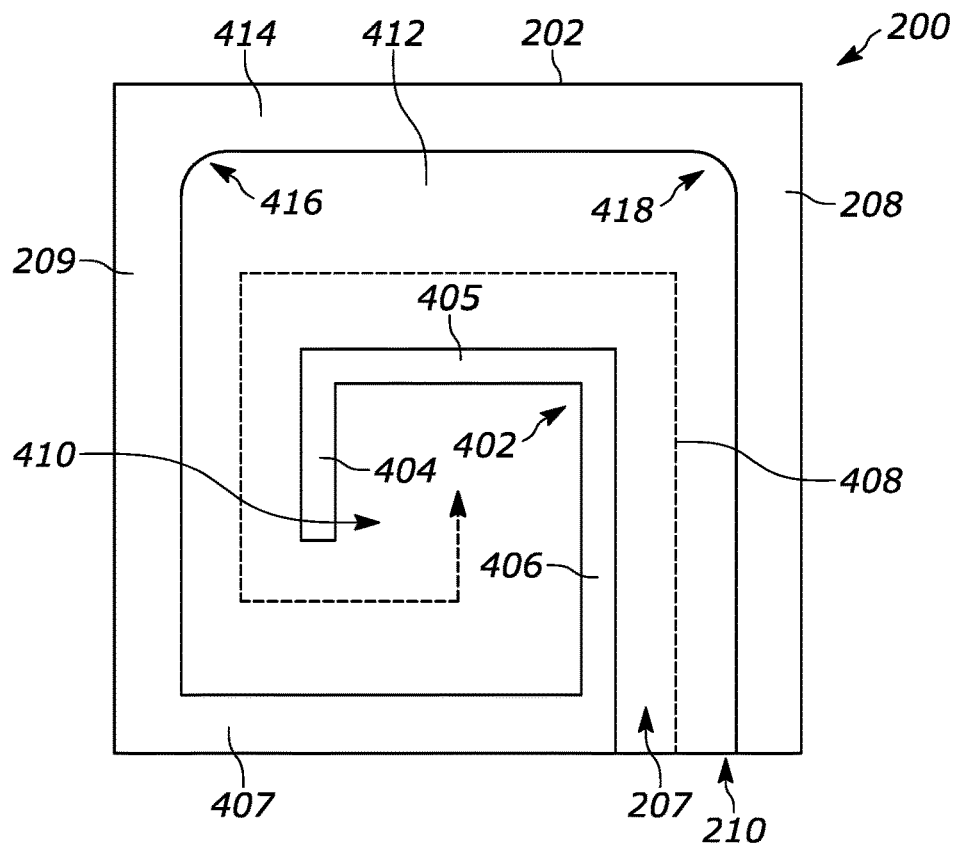
FIG. 4 is a bottom view of a sound port adapter with a first configuration in accordance with one example.
Figure 5:
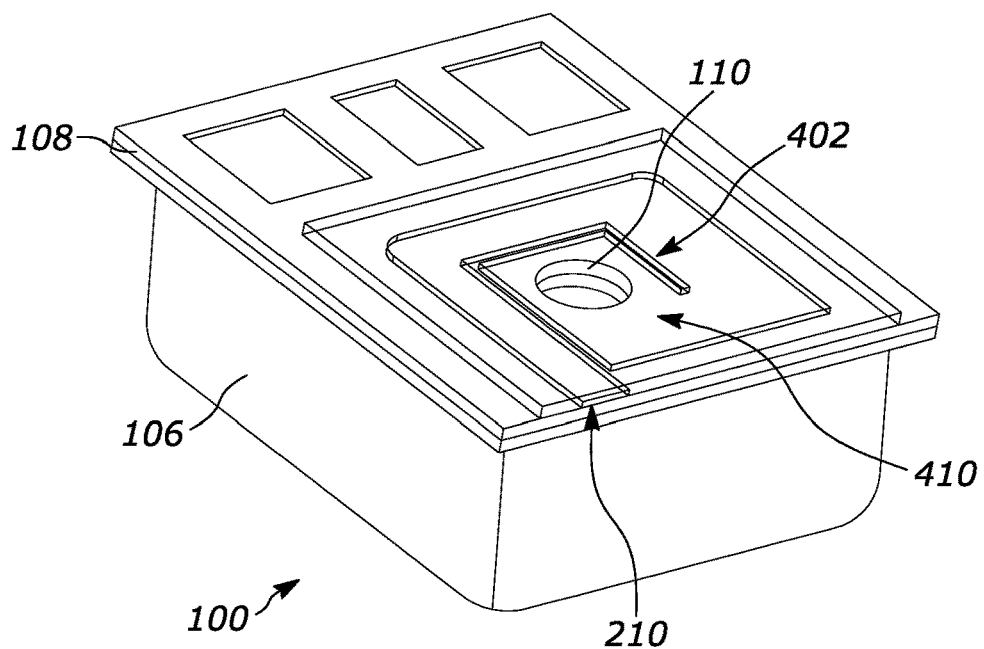
FIG. 5 is a transparent view of the sound port adapter of FIG. 4 coupled to the microphone assembly of FIG. 2.
Figure 6:
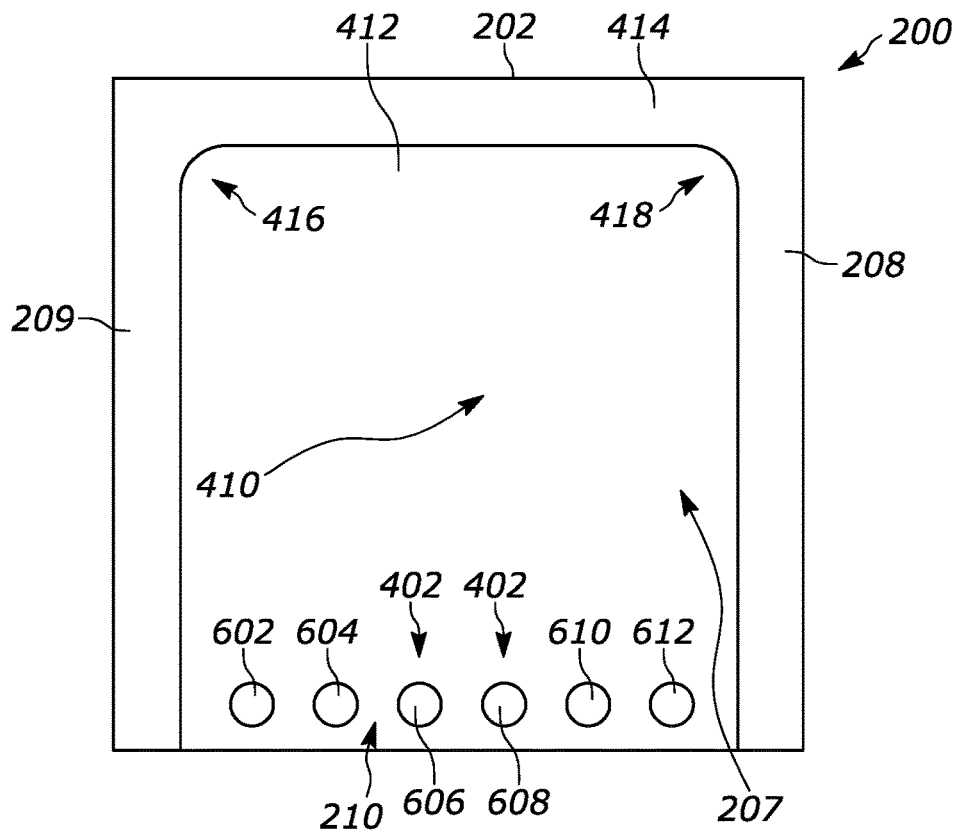
FIG. 6 is a bottom view of a sound port adapter with a second configuration in accordance with one example.
Figure 7:
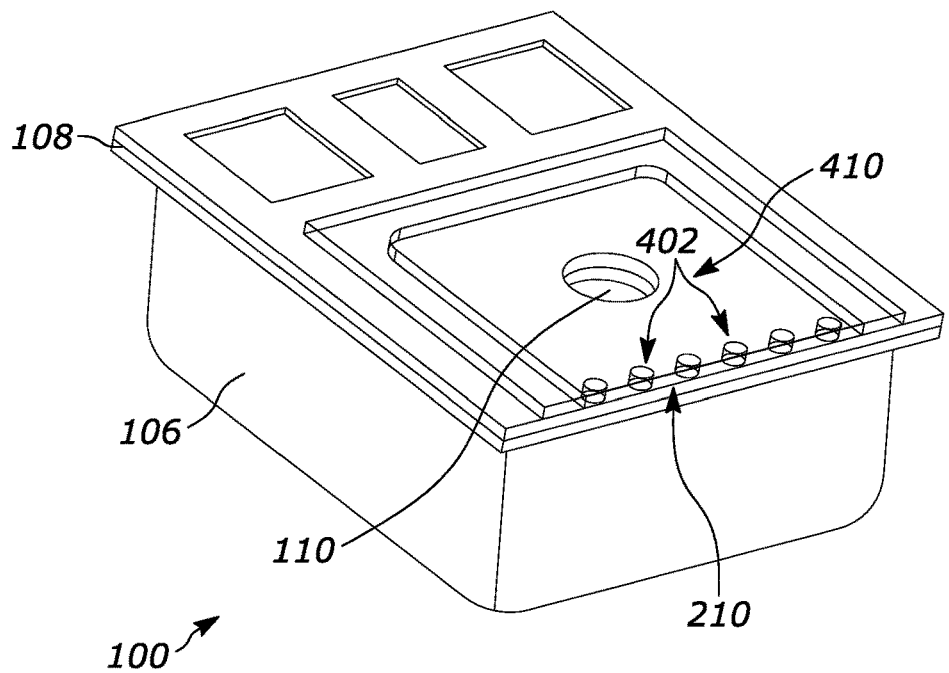
FIG. 7 is a transparent view of the sound port adapter of FIG. 6 coupled to the microphone assembly of FIG. 2.

In various embodiments, the sound port adapter may be configured for acoustic tuning (e.g., modify an acoustic property of sound propagating through the acoustic channel) and, if desired, for ingress protection (e.g., prevent debris from entering the acoustic channel). FIGS. 4-15 show different configurations of the sound port adapter 200 coupled to the microphone assembly. In FIGS. 4-5, the sound port adapter is configured to modify an inertance of the acoustic channel and to provide ingress protection. In FIGS. 6-7, the sound port adapter is configured to modify an acoustic resistance of the acoustic channel and to provide ingress protection. In FIGS. 8-15, the sound port adapter is configured to modify both the inertance and acoustic resistance of the acoustic channel as well as to provide ingress protection.

To modify the acoustic property of the acoustic channel, various tuning structures can be formed in the acoustic channel. In FIGS. 4-5, the tuning structure is a wall portion 402 configured to modify an inertance of the acoustic channel by acoustically tuning the sound propagating through the acoustic channel. In this example, the wall portion includes four wall segments 404-407 connected at right angles. The wall segments are arranged in a way to define a non-straight path 408 with multiple turns for the sound to follow when moving from the sound inlet to a sound outlet 410. The sound inlet is also narrowed by the placement of the wall segments 406, 407 with respect to the sidewall 208. In general, the wall portion may be configured to form any type of non-straight acoustic channel to modify the inertance, such as a snail tube acoustic channel (e.g., spiral turns), a tortuous acoustic channel (e.g., winding or twisting path), or any other suitably shaped acoustic channel (e.g., S-shape, sinusoidal-shape, zigzag-shape, serpentine-shape, etc.).

In forming the acoustic channel of FIG. 4, the wall portion extends into a cavity 412 defined by the two sidewalls 208, 209 and a third sidewall 414. Here, the wall segment 407 is merged with one of the sidewalls 209. The arrangement of the wall segments also serves to obstruct debris and other materials from entering the acoustic channel and reaching the sound port. While the cavity is shown with rounded corners 416, 418, other corner radiuses and shapes are contemplated in other embodiments.

In FIGS. 6-7, the wall portion is configured to modify an acoustic resistance of the acoustic channel by acoustically tuning a frequency of the sound propagating through the acoustic channel. To achieve this, the wall portion is in the form of a plurality of discrete wall portions 602-612 arranged horizontally across the acoustic channel (e.g., parallel with respect to the sound inlet). In this example, the discrete wall portions are embodied as six equally sized cylindrical pillars. However, any number of suitably sized shapes in repeated patterns may be contemplated in other embodiments to modify the acoustic resistance.

The discrete wall portions are arranged in spaced-apart relation. In one example, the distance between each of the discrete wall portions may be set to 0.1 mm. In other examples, this distance may be adjusted as desired. The space between each of the discrete wall portions forms the sound inlet to allow sound to travel to the sound outlet. This arrangement also acts like a mesh or screen to prevent debris from entering the acoustic channel. Multiple rows of wall portions each offset from wall portions in adjacent rows may be used in other embodiments.

Figure 8:
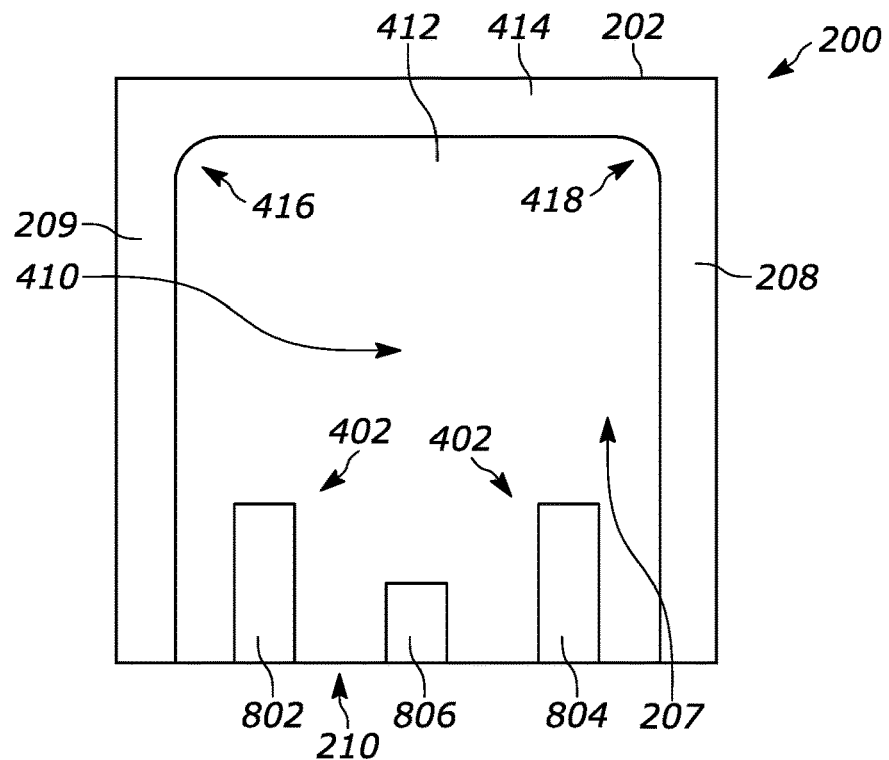
FIG. 8 is a bottom view of a sound port adapter with a third configuration in accordance with one example.
Figure 9:
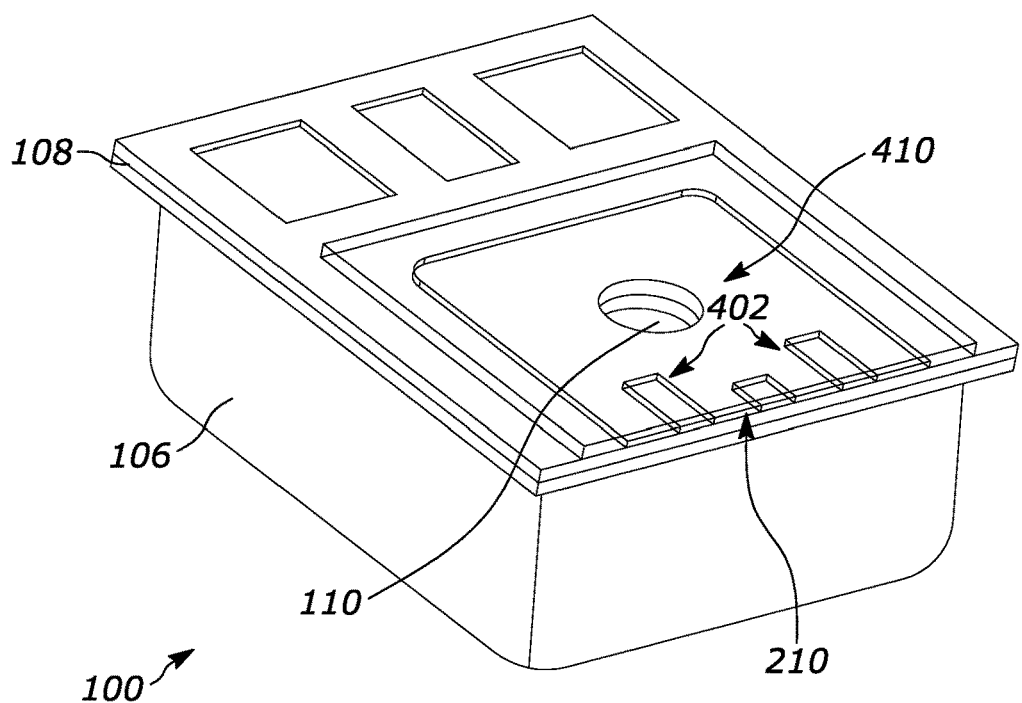
FIG. 9 is a transparent view of the sound port adapter of FIG. 8 coupled to the microphone assembly of FIG. 2.

In FIGS. 8-9, instead of cylindrical pillars, the wall portion is in the form of a plurality of rectangular columns 802-806. While three columns are shown, any suitable number of columns may be used. The columns are equally spaced across the acoustic channel, but two of the columns (802, 804) are larger in size. As desired, individual columns may vary in size (e.g., length, width), shape (e.g., polygonal), and location (e.g., variable distance between the columns). The rectangular columns serve to provide both inertance and acoustic resistance tuning of the acoustic channel as well as ingress protection.

Figure 10:
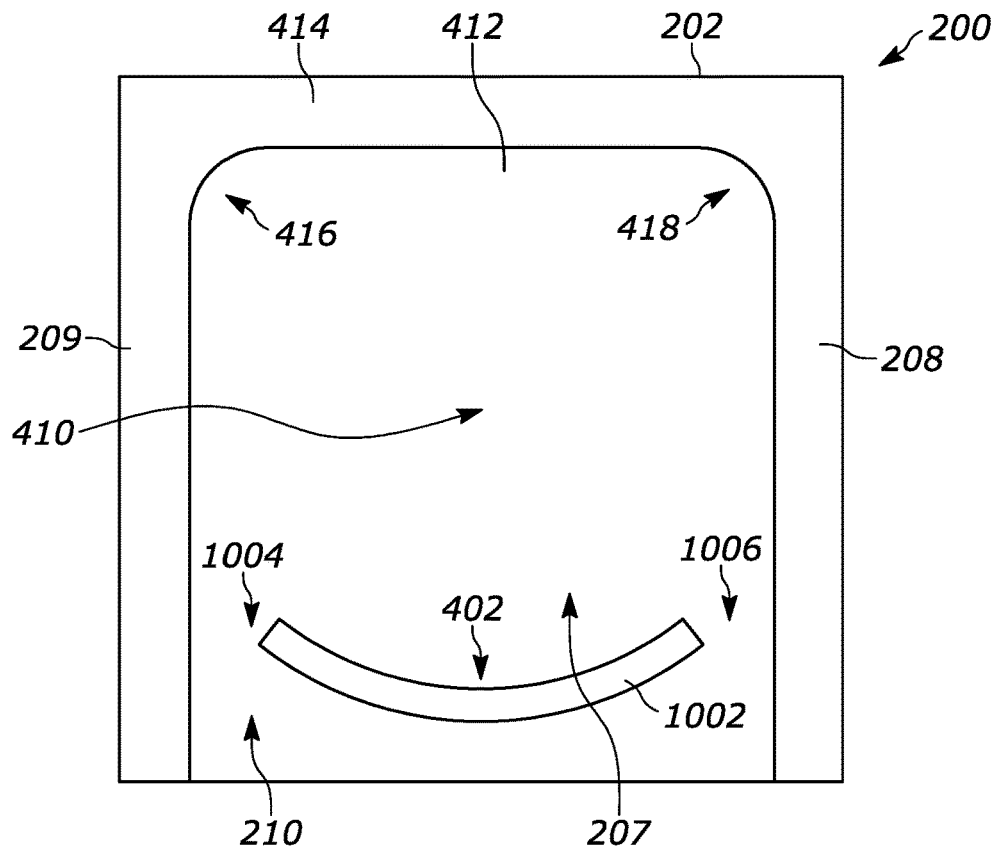
FIG. 10 is a bottom view of a sound port adapter with a fourth configuration in accordance with one example.
Figure 11:
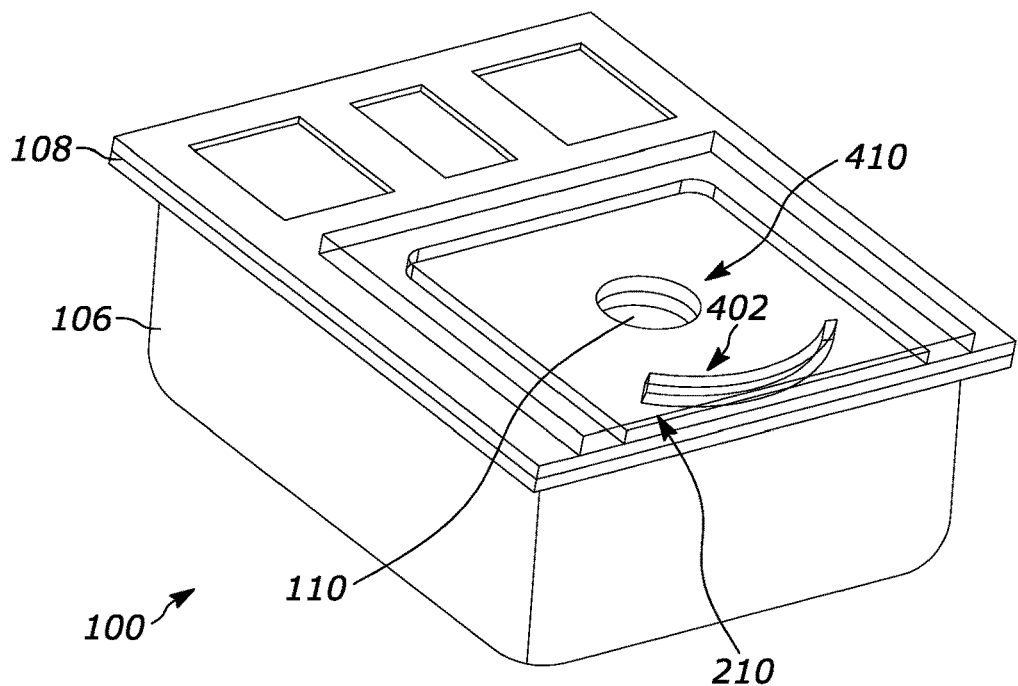
FIG. 11 is a transparent view of the sound port adapter of FIG. 10 coupled to the microphone assembly of FIG. 2.

In FIGS. 10-11, instead of having a plurality of discrete wall portions, a single discrete wall portion 1002 is shown. In this example, the single discrete wall portion is an upward facing arcuate barrier. In other examples, the single discrete wall portion may include other suitable shapes and/or configurations (e.g., a downward facing arcuate barrier, a planar barrier, an angled barrier, etc.). The arcuate barrier is disposed partially across the acoustic channel such that gaps 1004, 1006 between the arcuate barrier and the sidewalls form the openings for the sound inlet. The arcuate barrier serves to provide both inertance and acoustic resistance tuning of the acoustic channel as well as ingress protection.

Figure 12:
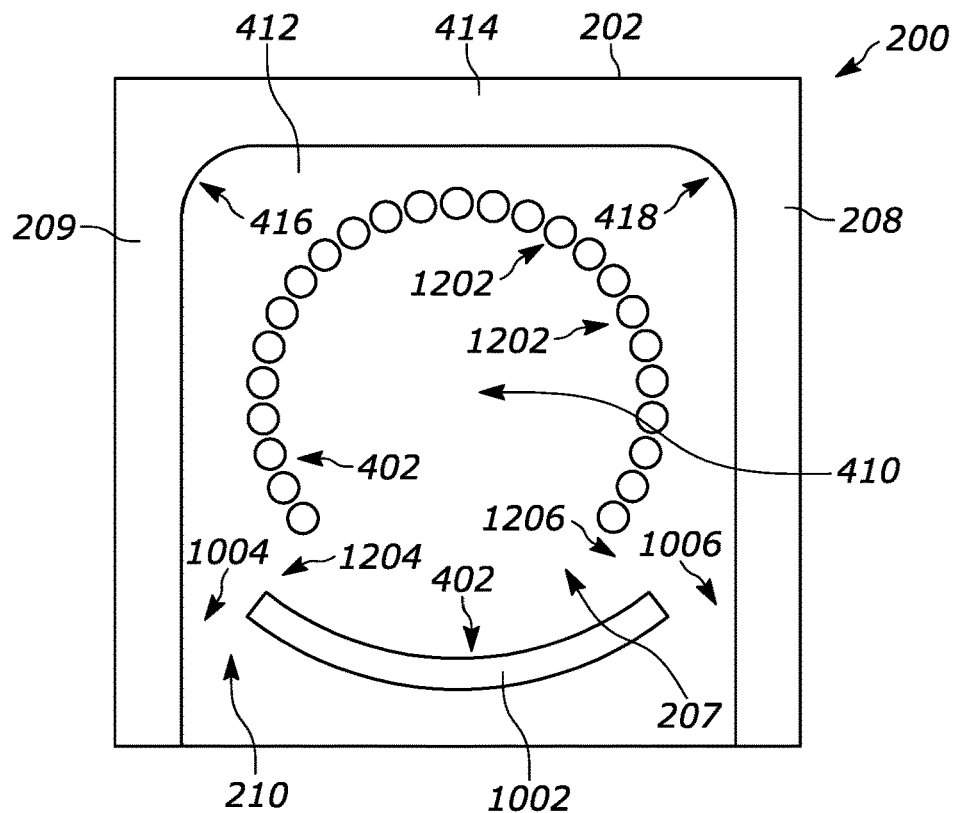
FIG. 12 is a bottom view of a sound port adapter with a fifth configuration in accordance with one example.
Figure 13:
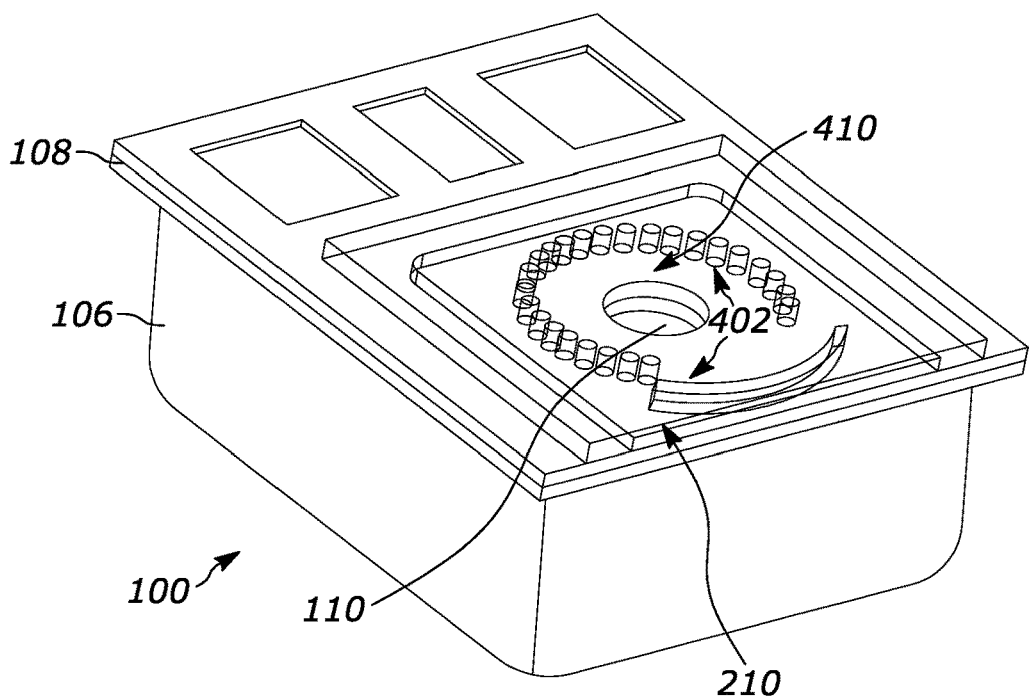
FIG. 13 is a transparent view of the sound port adapter of FIG. 12 coupled to the microphone assembly of FIG. 2.

In some embodiments, the wall portion may include a combination of different types of discrete wall portions. In FIGS. 12-13, the wall portion is comprised of a plurality of discrete wall portions 1202 (embodied as twenty-five equally-spaced cylindrical pillars) and a single discrete wall portion (embodied as the arcuate barrier 1002). The arcuate barrier is disposed partially across the acoustic channel such that the gaps 1004, 1006 form the openings for the sound inlet. The cylindrical pillars are disposed around the sound outlet. In particular, the cylindrical pillars are arranged in a semi-circular fashion to partially surround the sound port. Gaps 1204, 1206 between the cylindrical pillars and the arcuate barrier couple the openings of the sound inlet to the sound outlet. Alternative combinations and arrangements of different types of discrete wall portions in the acoustic channel may be contemplated in other embodiments.

Figure 14:
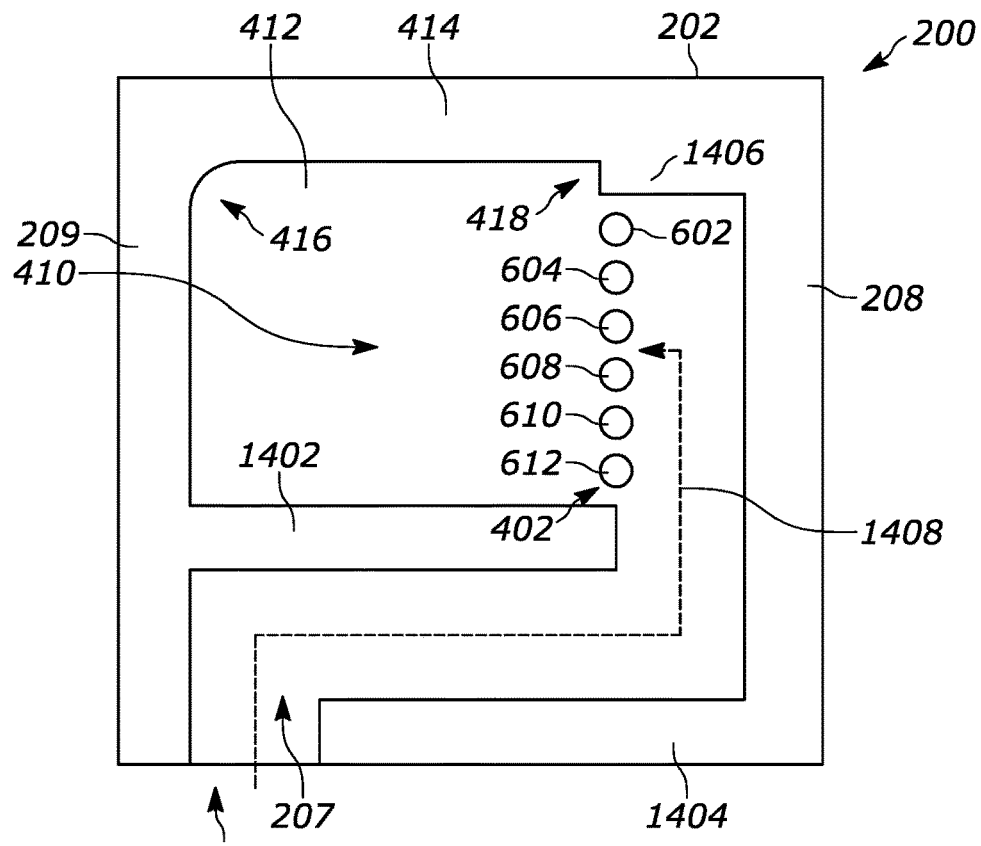
FIG. 14 is a bottom view of a sound port adapter with a sixth configuration in accordance with one example.
Figure 15:
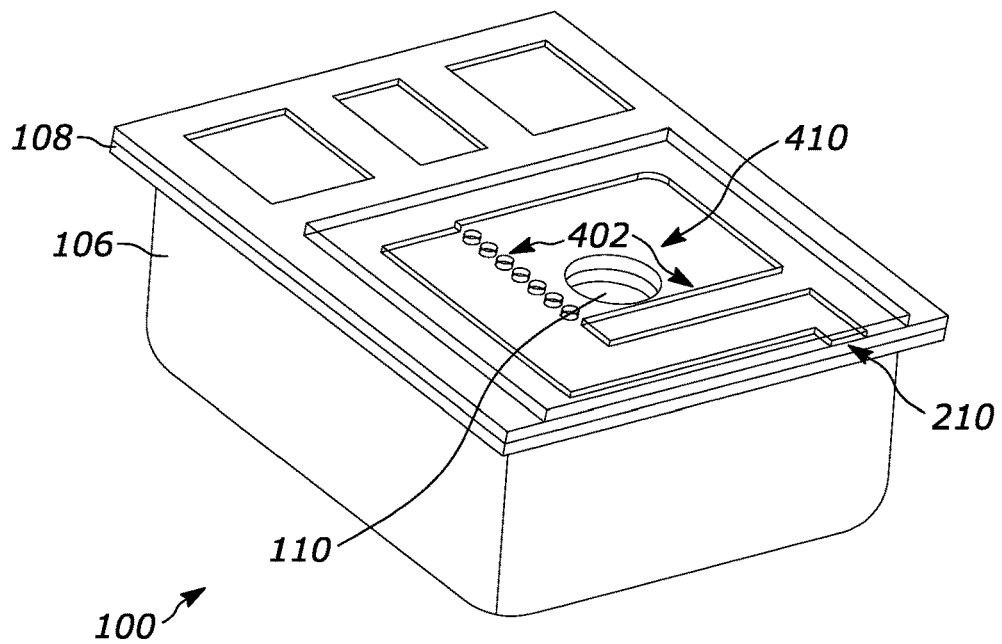
FIG. 15 is a transparent view of the sound port adapter of FIG. 14 coupled to the microphone assembly of FIG. 2.

In some embodiments, the wall portion may include discrete wall portions in a tortuous acoustic channel. In FIGS. 14-15, the wall portion is comprised of the cylindrical pillars 602-612 and wall segments 1402-1406. The wall segments 1402, 1404 are disposed horizontally (e.g., parallel) across the sound inlet and merged with the sidewalls 209, 208, respectively. The wall segment 1406 is disposed at the corner 418 and merged with the sidewalls 209, 414 to form a notch at the corner. The sound inlet is also narrowed by the placement of the wall segment 1404 with respect to the sidewall 209. This arrangement of the wall segments defines a non-straight path 1408 with three turns for the sound to follow from the sound inlet to the sound outlet.

In this example, the cylindrical pillars are located near the sound outlet and disposed vertically between ends of the wall segments 1402 and 1406 (e.g., perpendicular with respect to the sound inlet). In other examples, the cylindrical pillars may be located near the sound inlet. Other configurations of a tortuous acoustic channel with one or more discrete wall portions are contemplated in other embodiments.

Among other advantages, employing a one-piece port adapter with a microphone assembly provides a small form factor with reduced material and processing costs. By forming various acoustic tuning structures into the one-piece port adapter, precise acoustic tuning and ingress protection can be achieved in a compact design. Other benefits will be recognized by those of ordinary skill in the art.

While the present disclosure and what is presently considered to be the best mode thereof has been described in a manner that establishes possession by the inventors and that enables those of ordinary skill in the art to make and use the same, it will be understood and appreciated that there are many equivalents to the exemplary embodiments disclosed herein and that myriad modifications and variations may be made thereto without departing from the scope and spirit of the disclosure, which is to be limited not by the exemplary embodiments but by the appended claims.

The invention claimed is:

1. A sound port adapter for a microphone assembly comprising an acoustic transducer disposed in a housing having a sound port, the sound port adapter comprising:
   a body member having a mounting surface configured to mount on the housing of the microphone assembly;
   an acoustic channel disposed through the body member, the acoustic channel defined in part by a cavity having a sound inlet and a sound outlet disposed on the mounting surface of the body member;
   a wall portion of the body member extending into the cavity, the wall portion configured to modify an acoustic property of the acoustic channel,
   wherein the sound outlet of the sound port adapter is acoustically coupled to a sound port of the microphone assembly when the sound port adapter is mounted over the sound port of the microphone assembly.

2. The sound port adapter of claim 1, the wall portion configured to modify an inertance of the acoustic channel, wherein the inertance acoustically tunes sound propagating through the acoustic channel.

3. The sound port adapter of claim 1, the wall portion configured to form a tortuous acoustic channel.

4. The sound port adapter of claim 1, the wall portion configured to form a snail tube acoustic channel.

5. The sound port adapter of claim 1, the wall portion configured to acoustically tune a frequency of sound propagating through the acoustic channel.

6. The sound port adapter of claim 5, the wall portion comprising a plurality of discrete wall portions arranged in spaced-apart relation across the acoustic channel.

7. The sound port adapter of claim 5, the wall portion comprising an arcuate barrier disposed partially across the sound inlet.

8. The sound port adapter of claim 1, wherein the wall portion is configured to obstruct entry of debris into the acoustic channel.

9. The sound port adapter of claim 8, the wall portion configured to form a tortuous acoustic channel, and the wall portion comprising a plurality of discrete wall portions arranged, in spaced-apart relation, across the tortuous acoustic channel.

10. The sound port adapter of claim 1, the wall portion configured to modify an inertance and an acoustic resistance of the acoustic channel.

11. The sound port adapter of claim 1, the acoustic channel configured to convert a top or bottom port microphone assembly to a side-port microphone assembly when the sound port adapter is mounted on the microphone assembly.

12. The sound port adapter of claim 1 is an unassembled unitary member.

13. The sound port adapter of claim 1 in combination with the microphone assembly comprising:
- a housing having a sound port and an external-device interface with electrical contacts;
- a microelectromechanical systems (MEMS) transducer disposed in the housing;
- an integrated circuit disposed in the housing, the integrated circuit electrically coupled to an output of the MEMS transducer and to the electrical contacts,
- wherein the sound port adapter converts is mounted over the sound port of the microphone assembly.

14. The sound port adapter of claim 13 is a conductive member electrically connectable to a ground plane of the microphone assembly when the sound port adapter is mounted on the microphone assembly.

15. An unassembled unitary sound port adapter for a microphone assembly comprising an acoustic transducer disposed in a housing having a sound port on a top or bottom portion of the housing, the sound port adapter comprising:
- a conductive body member having a mounting surface configured to mount over the sound port of the microphone assembly;
- an acoustic channel disposed through the conductive body member, the acoustic channel defined in part by a cavity having a sound inlet and a sound outlet disposed on the mounting surface of the body member, the sound inlet disposed on a different surface of the body member than the sound outlet;
- a wall portion of the body member disposed in the cavity, the wall portion configured to modify an acoustic property of the acoustic channel,
- wherein the sound port adapter converts the top or bottom port microphone assembly to a side-port microphone assembly when mounted over the sound port of the microphone assembly.

16. An apparatus comprising:
- a microphone including a housing with an inner surface and an outer surface, the housing having an acoustic port that extends from the outer surface to the inner surface, the microphone including a microelectromechanical systems (MEMS) transducer disposed in the housing over the acoustic port; and
- a one-piece port adapter operatively coupled to the outer surface of the housing over the acoustic port, the one-piece port adapter defining an acoustic channel with an acoustic tuning structure such that acoustic energy is modified by the acoustic tuning structure while moving through the acoustic channel.

17. The apparatus of claim 16, the acoustic tuning structure configured to modify one or more of an inertance and an acoustic resistance of the acoustic energy while the acoustic energy moves through the acoustic channel.

18. The apparatus of claim 16, the acoustic tuning structure comprising a portion configured to obstruct debris from entering the acoustic channel.

19. The apparatus of claim 16, the acoustic tuning structure defining a non-straight acoustic path in the acoustic channel.

20. The apparatus of claim 16, the outer surface of the housing including a ground plane and the one-piece port adapter is a conductive member electrically coupled to the ground plane.

* * * * *